United States Patent

[19]

Gates

[11] Patent Number: 6,050,327
[45] Date of Patent: Apr. 18, 2000

[54] ELECTRONIC APPARATUS HAVING AN ENVIRONMENTALLY SEALED EXTERNAL ENCLOSURE

[75] Inventor: William George Gates, Wolverton, United Kingdom

[73] Assignee: Lucent Technologies Inc., Murray Hill, N.J.

[21] Appl. No.: 09/273,018

[22] Filed: Mar. 19, 1999

[30] Foreign Application Priority Data

Mar. 24, 1998 [EP] European Pat. Off. .............. 98302167

[51] Int. Cl.[7] .......................................................... F28F 7/00
[52] U.S. Cl. .................................. 165/80.3; 165/104.33; 165/104.34; 361/700; 257/715; 174/15.2
[58] Field of Search ............................. 165/80.3, 104.33, 165/185, 104.34; 361/700, 696, 697, 714; 257/715, 722; 174/15.2

[56] References Cited

U.S. PATENT DOCUMENTS

| | | | |
|---|---|---|---|
| 3,226,602 | 12/1965 | Elfving | 361/700 |
| 5,793,611 | 8/1998 | Nakazato et al. | 165/104.33 |
| 5,842,514 | 12/1998 | Zapach et al. | 165/104.33 |

FOREIGN PATENT DOCUMENTS

| | | | |
|---|---|---|---|
| 0229188 | 12/1984 | Japan | 165/104.34 |
| 40218379 | 5/1990 | Japan | 165/104.34 |
| 403030400 | 2/1991 | Japan | 361/700 |
| 403093295 | 4/1991 | Japan | 361/700 |
| 405052490 | 3/1993 | Japan | 165/104.34 |
| 406164163 | 6/1994 | Japan | 361/700 |
| 1521464 | 8/1978 | United Kingdom | 165/104.33 |

*Primary Examiner*—Christopher Atkinson

[57] ABSTRACT

Electronic apparatus is disclosed having components mounted within an environmentally sealed external enclosure. The external enclosure is made of heat conductive material and some of the components are mounted in heat conductive association with one or more walls of the external enclosure. The apparatus includes at least one heat pipe that has an evaporator in thermally conductive contact with a wall of the external enclosure proximate to one of the components. The condenser of the heat pipe is located outside the external enclosure and is provided with thermally conductive fins. Components that generate large amounts of heat can thus be provided with additional cooling reducing local hot spots. The external enclosure may be designed for the larger market in temperate climates, and be modified for hotter climates.

8 Claims, 2 Drawing Sheets

ELECTRONIC APPARATUS HAVING AN ENVIRONMENTALLY SEALED EXTERNAL ENCLOSURE

CROSS-REFERENCE TO RELATED APPLICATION

This application claims priority of European Patent Application No. 98302167.6, which was filed on Mar. 24, 1998.

FIELD OF THE INVENTION

This invention relates to electronic apparatus having components mounted within an environmentally sealed external enclosure.

BACKGROUND OF THE INVENTION

Much electronic apparatus requires cooling. In many cases this is effected by blowing air through an external enclosure that contains the electronic apparatus via vents in the external enclosure. Within the external enclosure, components that generate large amounts of heat may be mounted on heat sinks either individually or in groups.

In some situations, for example when the apparatus is to be used outside, the external enclosure must be environmentally sealed. One example of this is base station equipment for a mobile communications network, where an external enclosure containing a transmitter/receiver, a power amplifier, a processor and other units, is mounted outside e.g. on a pole.

The environmental seal prevents air from being blown through the external enclosure. Conventionally, the environmentally sealed external enclosure may be provided with extended surfaces to increase its surface area, thus allowing the whole external enclosure to be cooled by convection. In some instances it is difficult to cool the external enclosure sufficiently, particularly in the region of the components that generate relatively large amounts of heat.

SUMMARY OF THE INVENTION

The invention solves the above problems by providing an electronic apparatus having components mounted within an environmentally sealed external enclosure made of heat conductive material with some of the components mounted in heat conductive association with one or more walls of the external enclosure and at least one heat pipe. The heat pipe has an evaporator in thermally conductive contact with a wall of the external enclosure proximate one of the components, a condenser located outside the external enclosure, and thermally conductive fins. Thus, components that generate large amounts of heat can be provided with additional cooling reducing local hot spots. The external enclosure may be designed for the larger market in temperate climates, and be modified for hotter climates.

In one preferred form the external enclosure is in two parts sealed together along a joint and separately containing respective components so that at least one wall of the container is in two parts. The external enclosure has at least two heat pipes. A first heat pipe extends through one part of the wall that is in two parts, and a second heat pipe extends through the other part of the wall that is in two parts. Each heat pipe has its evaporator in thermal conductive contact with another wall of the respective part of the external enclosure. In that form, the heat pipes are spaced from one another in a direction along the joint between the two part external enclosures. The apparatus may include a plurality of heat pipes in at least one of the parts of the external enclosures. The fins are preferably on all the heat pipes on each part of the external enclosure. The fins on heat pipes on different part external enclosures can be spaced different distances from the external enclosure. The fins on each part of the external enclosure are preferably notched to receive the heat pipes on the other part of the external enclosure.

Additionally, the cooling effect of the heat pipes may be significantly increased by a blower to force air across the condensers of the heat pipes.

BRIEF DESCRIPTION OF THE DRAWINGS

One embodiment of the invention will now be described, by way of example, with reference to the accompanying drawings, in which.

DETAILED DESCRIPTION

Figure 1:
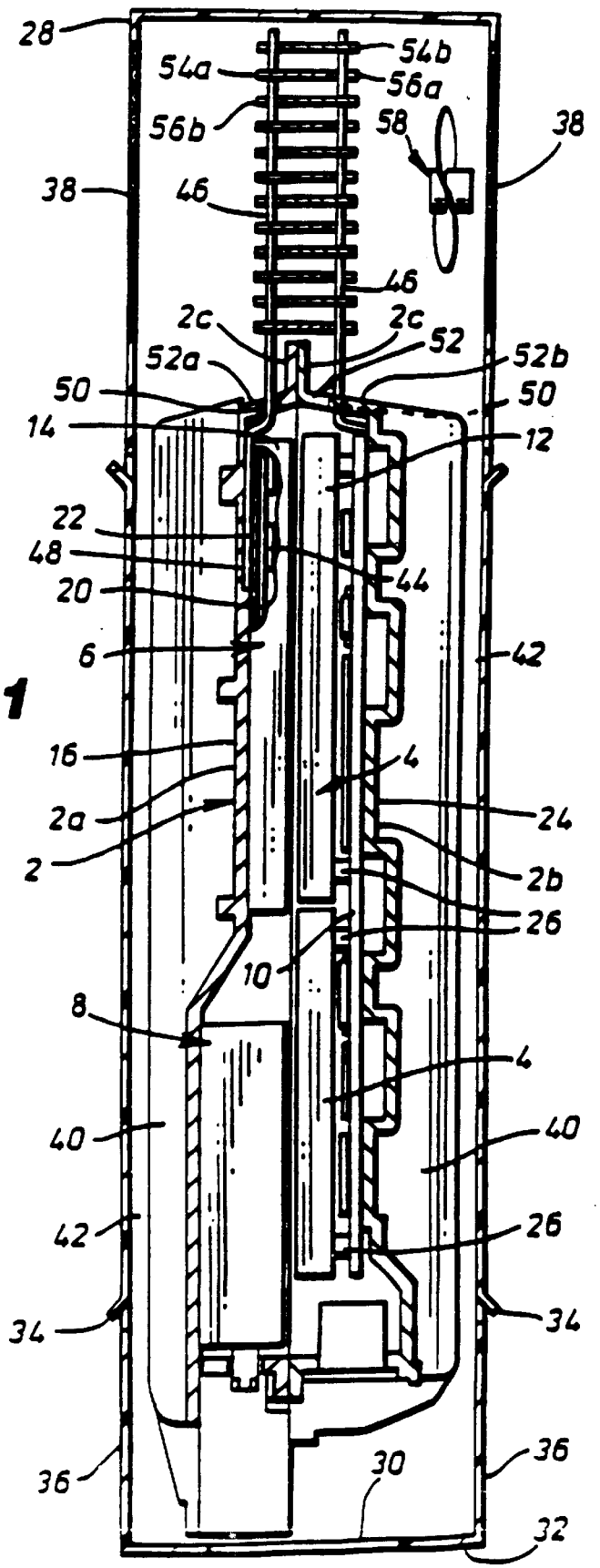
FIG. 1 is a vertical cross section through apparatus embodying the invention in the form of base station equipment for a mobile telecommunications network.

Referring to FIG. 1, base station equipment for a mobile telecommunications network has a thermally conductive external enclosure 2. The external enclosure can be cast, for example, from light metal in two parts 2a and 2b environmentally sealed around a joint between two flanges 2c. The external enclosure contains two transmitter/receiver units 4, two power amplifiers 6, two duplexers 8 and a processor board 10. The transmitter/receiver units 4 and power amplifiers 6 are shielded against radio frequency emissions by aluminum cases 12 and 14. The two power amplifiers 6 are mounted side by side on a wall 16 of the container so only one is visible in FIG. 1. Similarly the two duplexers 8 are mounted side by side on the wall 16. The power amplifiers and duplexers are thus in thermally conductive contact with the walls 16. A circuit board 20 is mounted in contact with a wall 22 of the case 14 so that components on the board are in conductive association with the wall 16, that is to say heat generated by a component can be conducted to the wall 16 via the circuit board 20 and the wall 22 of the case 14.

The processor board 10 is mounted directly on a wall 24 opposite the wall 16, again in thermally conductive contact. Components on the processor board 10 are thus also in thermally conductive association with the wall 24. The transmitter/receiver units 4 are mounted on pillars 26 over the processor board 10.

The external enclosure 2 is contained by a ventilated case 28 having vents 30 in its bottom 32, louvers 34 in its side walls 36, and apertures covered by grills 38 near the top of its side walls 36. The walls 16 and 24 have extended surfaces 40 that project into air passages 42 between the external enclosure 2 and the case 28.

Components in the external enclosure are thus cooled by thermal conduction to and through the walls 16 and 24 of the external enclosure 2 and by natural convection over the extended surfaces 40.

Figure 2:
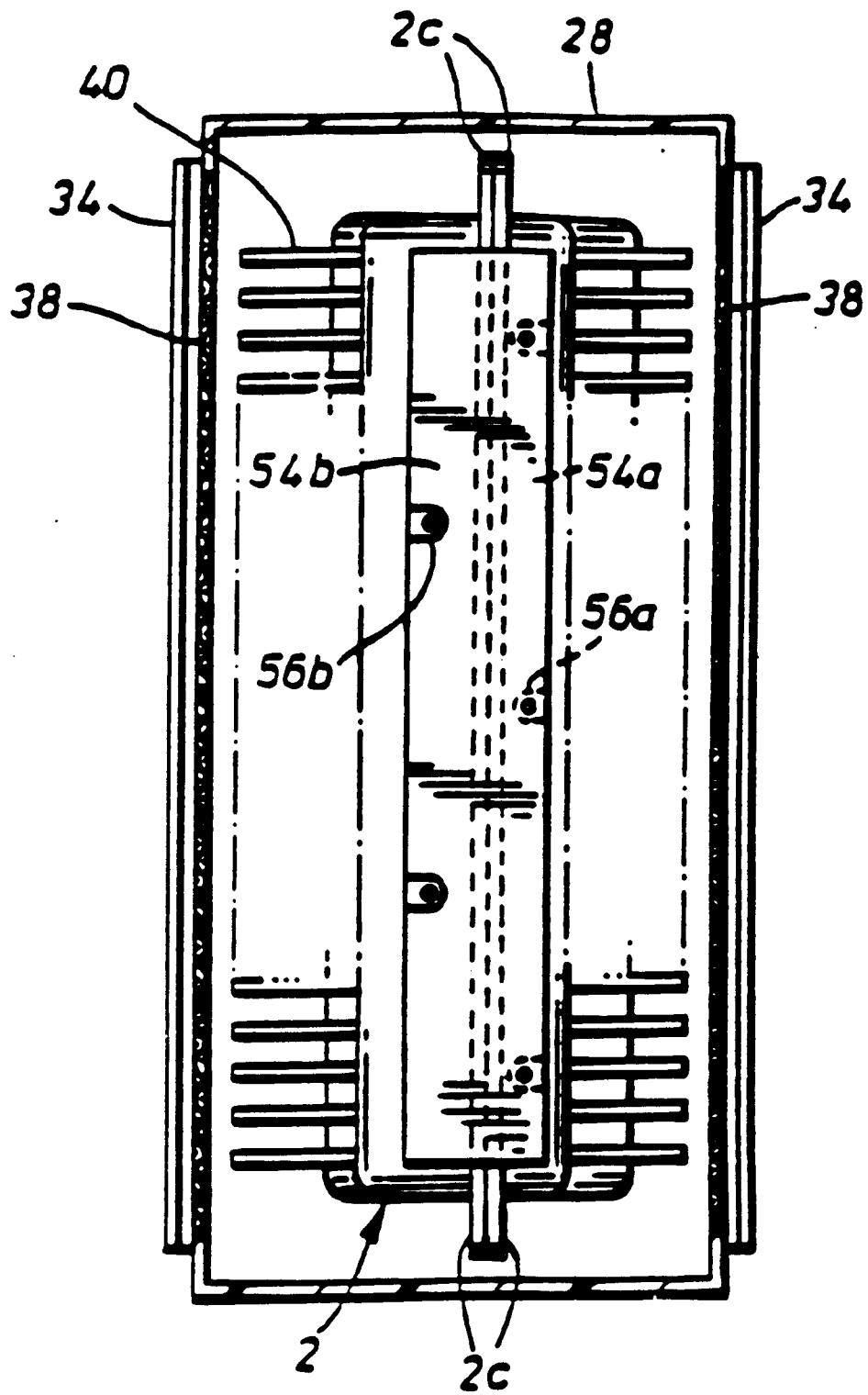
FIG. 2 is a plan view of the equipment of FIG. 1 with the top cover removed.

Some components e.g. power transistors 44 generate such large amounts of heat that the cooling already described may be insufficient. Such local hot spots are cooled by heat pipes 46. The evaporator of each heat pipe 46 is pressed into a groove 48 in the wall 16 or 24 so as to extend to the hot spot in the region of a component such as the power transistors 44 that generates relatively large amounts of heat. Each heat pipe extends from its groove 48 through an aperture 50 in the part 52a or 52b of the top wall 52 belonging to the part 2a or 2b of the external enclosure in which it is mounted. The heat pipes may be sealed in their apertures, for example, by a silicone sealant. As may be seen from FIG. 2, the heat pipes are spaced in a direction along the joint between the flanges 2c. A set of heat conductive transverse fins 54a is on the evaporators of the heat pipes 46 extending from the part 2a of the external enclosure. The fins 54a have notches 56a to accommodate the heat pipes extending from the other part 2b of the external enclosure. Similarly, a set of heat conductive transverse fins 54b is on the heat pipes extending from the part 2b of the external enclosure. The fins 54b are interleaved between the fins 54a. The fins 54b have notches 56b to accommodate the heat pipes extending from the other part 2b of the external enclosure. Provision of the finned heat pipes greatly improves the cooling especially at the hot spots where they terminate.

Further improvement in cooling may be obtained by forcing convection over the fins. To that end, a blower in the form of an electrically driven fan 58 is provided inside one or both aperture 38.

In the embodiment shown, the evaporators of the heat pipes pass through the top wall of the external enclosure. In an alternative (not shown) the evaporators are pressed into a groove on the outside of the walls of the external enclosure.

While the invention has been described with reference to a preferred embodiment, it will be understood by those skilled in the art having reference to the specification and drawings that various modifications may be made and various alternatives are possible therein without departing from the spirit and scope of the invention.

I claim:

1. An electronic apparatus comprising:
   an environmentally sealed external enclosure made of heat conductive material;
   the external enclosure is in two parts sealed together along a joint, each of the parts separately containing one or more components mounted within the external enclosure;
   the external enclosure having a first wall part and a second wall part, the first wall part corresponding to one of the parts of the external enclosure and the second wall part corresponding to another of the parts of the external enclosure, wherein one or more of the components are each mounted in heat conductive association with one or more walls of the external enclosure; and
   at least two heat pipes, wherein a first of the heat pipes extends through the first wall part and a second of the heat pipes extends through the second wall part;
   each heat pipe having;
      an evaporator in thermal conductive contact with one wall of the respective part of the external enclosure proximate to one of the components;
      a condenser located outside the external enclosure; and
      one or more thermally conductive fin.

2. Apparatus as claimed in claim 1, wherein the heat pipes are spaced from one another in a direction along the joint between the two parts of the external enclosure.

3. Apparatus as claimed in claim 1, comprising a plurality of heat pipes in at least one of the parts of the external enclosures.

4. Apparatus as claimed in claim 3, wherein the fins on the heat pipes on one of the parts of the external enclosure being spaced a different distance from the fins on the heat pipes on another of the parts of the external enclosure.

5. Apparatus as claimed in claim 4, wherein fins of the heat pipes on each of the parts of the external enclosure are notched to receive the heat pipes on the other of the parts of the external enclosure.

6. Apparatus as claimed in claim 3, wherein fins of the heat pipes on each of the parts of the external enclosure are notched to receive the heat pipes on the other of the parts of the external enclosure.

7. Apparatus as claimed in claim 1, wherein fins of the heat pipes on each of the parts of the external enclosure are notched to receive the heat pipes on the other of the parts of the external enclosure.

8. Apparatus as claimed in claim 1, further comprising a blower to force air across the condensers of the heat pipes.

* * * * *